United States Patent

Ophey et al.

[11] Patent Number: 6,108,138
[45] Date of Patent: *Aug. 22, 2000

[54] OPTICAL BEAM SHAPER, AND RADIATION SOURCE UNIT AND SCANNING DEVICE INCLUDING SAID BEAM SHAPER

[75] Inventors: Willem G. Ophey; Josephus J. M. Braat, both of Eindhoven, Netherlands

[73] Assignee: U.S. Philips Corporation, New York, N.Y.

[*] Notice: This patent is subject to a terminal disclaimer.

[21] Appl. No.: 08/488,312

[22] Filed: Jun. 7, 1995

[30] Foreign Application Priority Data

Jun. 7, 1994 [EP] European Pat. Off. ............. 94201609

[51] Int. Cl.[7] ........................................ G11B 7/00
[52] U.S. Cl. ............................................ 359/711; 359/708
[58] Field of Search ............................ 359/708, 710, 359/711; 369/100

[56] References Cited

U.S. PATENT DOCUMENTS 3,876,842 4/1975 Bouwhuis .
4,358,200 11/1982 Heemskerk et al. .
4,924,079 5/1990 Opheij et al. .
5,068,751 11/1991 Braat et al. ............................. 359/566
5,467,335 11/1995 Braat ...................................... 369/100

FOREIGN PATENT DOCUMENTS

| 0286368 | 10/1988 | European Pat. Off. . |
| 0583036 | 2/1994 | European Pat. Off. . |
| 0605923 | 7/1994 | European Pat. Off. . |
| 0605929 | 7/1994 | European Pat. Off. . |
| 135737 | 2/1989 | Japan . |

OTHER PUBLICATIONS

M.G. et al, "Het systeem 'Compact Disc Digital Audio'", Philips Techn T. 40, 82, No. 9, 1981, pp. 267–272.

*Primary Examiner*—Edward P. Westin
*Assistant Examiner*—Richard Hanig

[57] ABSTRACT

An optical beam shaper (10) for converting a radiation beam (5, 6, 7, 8) having an elliptical cross-section into a beam (9) having a more circular cross-section is described. This element (10) has a cylindrical entrance surface (12) and a toroidal exit surface (14) and can be arranged close to a diode laser (1) so that the risk of wavefront deviations due to defocusing is reduced. The element has a high coupling efficiency. The beam shaper is also provided with a grating for forming a sub-beam from the radiation beam.

17 Claims, 6 Drawing Sheets

OPTICAL BEAM SHAPER, AND RADIATION SOURCE UNIT AND SCANNING DEVICE INCLUDING SAID BEAM SHAPER

CROSS-REFERENCE TO RELATED APPLICATIONS

This application is related to concurrently filed patent application Ser. No. 08/408,756 by Josephus J. M. Braat for Optical Beam Splitting Element; and to co-pending application Ser. No. 08/175075 filed Dec. 29, 1993 by Josephus J. M. Braat for Beam-shaping Optical Element, and Radiation Source Unit and Scanning Unit Including said Element.

BACKGROUND OF THE INVENTION

The invention relates to an optical beam shaper having an entrance surface and an exit surface located opposite thereto for changing the shape of the cross-section of a first radiation beam incident on the entrance surface, the entrance surface and the exit surface having a common optical axis. The invention also relates to a radiation source unit and to an optical scanning device, both including such a beam shaper.

A beam shaper of this type is known, for example in the form of a prism, a cylindrical lens or, as described in European Patent Application no. 0 286 368, a single lens element whose entrance and exit surfaces have a toroidal shape. This beam shaper is generally used in combination with a diode laser which emits a beam whose angular aperture in a plane parallel to its active layer, known as the lateral plane, is smaller than the angular aperture in the plane perpendicular to the active layer, known as the transversal plane. In the field known as the far field, the beam of such a diode laser has an elliptical cross-section. In a device in which such a diode laser is used as a radiation source, for example, a reading and/or writing device for optical record carriers in which an audio or video program or data are or can be stored, or a printer, a round and small, preferably diffraction-limited radiation spot must be formed on the medium to be scanned. To this end an imaging system, or objective system, by means of which the radiation spot is formed must be filled with a radiation beam having a circular cross-section. It is known that, starting from a diode laser, such a beam can be obtained by arranging a beam shaper between this laser and the objective system and at some distance from the diode laser.

In known systems using a beam shaper, stringent requirements must be imposed on the beam shaper as well as on the positioning of this element with respect to the radiation source. The known beam shapers are designed in such a way that the beam shaping, hence the magnification or reduction of the beam cross-section, is realised in only one of the planes, the transversal or the lateral plane. Since the shaping in this plane must be relatively strong, stringent requirements are imposed on the parameters playing a role in beam shaping.

Moreover, in known systems using beam shaping, the beam shaper is arranged at a relatively large distance from the radiation source, viz. where the diverging beam emitted by the source has the required cross-section. However, stringent requirements are imposed on the axial or Z position of the exit plane of the diode laser with respect to the beam shaper. If the Z position of the diode laser exit plane differs from the desired position, the laser beam will have a wavefront with a quadratic defocusing term at the area of the entrance surface of the beam shaper. The quadratic distortion which is a function of the angle at which a given portion of the wavefront is viewed from the centre of the radiation source is transformed in different manners by the beam shaper in the two main cross-sectional planes, the XZ plane and the YZ plane. In fact, the known beam shapers have a relatively large angular magnification factor or scaling factor in one of these planes and a magnification equal to one in the other plane. If the beam-shaping ratio is larger than, for example two, the defocusing of the radiation source is substantially completely transformed by the beam shaper into a defocusing of the beam in only one of the main cross-sectional planes. This means that the beam emerging from the beam shaper has become astigmatic. Whereas in the optical systems under consideration a defocusing of the radiation source itself can be corrected by an active focus control for the objective system, an astigmatic wavefront error can no longer be eliminated. Consequently, stringent tolerance requirements are imposed on astigmatism. If an average wavefront deviation, i.e. the square root of the integral, across the surface of the wavefront, of the square value of the wavefront deviation divided by the surface, indicated by $OPD_{rms}$, of 0.02×the wavelength ($\lambda$) is still allowed, the astigmatic wavefront error $W_A$ should be smaller than 0.1 $\lambda$. This means that the defocusing $\Delta Z$ of the radiation source with respect to the beam shaper defined by $$\Delta Z = \frac{2 \cdot W_A}{(NA)^2}$$

may at most be of the order of 1.5 $\mu$m if the numerical aperture NA of the beam shaper is 0.35 and $\lambda$=0.8 $\mu$m.

In the commonly used optical systems, in which the beam shaper is arranged at a relatively large distance from the diode laser, such a strict tolerance requirement is difficult to satisfy. Due to temperature variations and mechanical shocks, axial displacements amounting to many microns may occur between the diode laser and the beam shaper.

SUMMARY OF THE INVENTION

It is an object of the present invention to provide a beam shaper and a radiation source unit including such a beam shaper with which and in which, respectively, said practical drawbacks are obviated to a considerable, or substantially complete extent.

A first aspect of the invention relates to a novel concept of a beam shaper. This element is characterized in that the entrance surface is provided with a substantially cylindrical portion with a cylindrical axis, which portion has an angular magnification of the order of $n_1/n_2$ in a transversal plane and an angular magnification of the order of $n_2/n_1$ in a lateral plane, in which the transversal plane and the lateral plane are perpendicular to each other and intersect each other along the optical axis, and the cylindrical axis is located in the transversal plane, and in which $n_2$ and $n_1$ are the refractive indices of the element material and the surrounding medium, respectively, and in that the exit surface is a toroidal surface, and in that at least one of said surfaces is provided with a grating.

The beam-shaping power is now constituted by two components, viz. an angular magnification n2/n1 in the lateral plane and an angular magnification n1/n2 in the transversal plane and each of these components can be realised with less stringent tolerance requirements than those which apply to a beam shaper in which the beam shaping is realised in only one of these planes.

As will be further described, a combination of three elementary imaging steps is used in the beam shaper according to the invention, which steps are known to be free from aberration and have a high tolerance with respect to the centration (the act of centering) and tilt of the refractive surfaces.

As already noted, European Patent Application no. 0 286 368 discloses a beam shaper having a toroidal exit surface. The entrance surface of this element is, however, not cylindrical but toroidal. This surface is intended for correcting aberrations in the transversal plane only, whereas the toroidal exit surface is intended for correcting aberrations in the lateral plane only. In the beam shaper according to the present invention the toroidal exit surface has for its purpose to image two intermediate images in one image, which intermediate images are formed in the lateral plane and the transversal plane, respectively, and are shifted in the direction of the optical axis, and the actual beam shaping is realised by the entrance surface.

There is little refraction at the exit surface of the beam shaper according to the invention, i.e. this surface has an angular magnification of approximately one. Consequently, the position of the radiation source observed via the beam shaper is stable at variations of all ambient parameters. This is particularly important for optical scanning devices which must have a stable position of the source with respect to detectors.

The beam shaper according to the invention may be arranged at a relatively short distance from the radiation source, so that it is reasonably simple to comply with the stringent requirements of tolerance imposed on the mutual positioning of the two components. This renders the beam shaper very suitable as a substrate for one or more gratings for generating sub-beams from the radiation beam. Such sub-beams should often be aligned accurately on a detection system, thus narrowing the tolerances for the mutual positions of the radiation source, the grating and the detector.

A first grating, which is preferably arranged on the beam shaper, is a grating having substantially straight, parallel grating lines for generating first sub-beams from the first radiation beam. In an optical scanning device these sub-beams may be used for generating tracking error signals so as to control the position of a scanning spot formed by the first radiation beam on a record carrier to be scanned.

A second grating, which is preferably arranged on the exit surface of the beam shaper, is a grating for generating a second sub-beam from a second radiation beam incident on the exit surface. In an optical scanning device this grating may be used for separating a part of the beam reflected by a record carrier to be scanned from the first radiation beam emitted by the laser and for guiding it towards a detection system. The second grating may have curved grating lines.

A second aspect of the invention relates to the influence of a variation of the mutual positions of the radiation source and the element on the wavefront of the beam emerging from the beam shaper. According to the invention this influence can be considerably reduced in a radiation source unit, if this unit is characterized in that the distance between the radiation-emitting surface of the diode laser and the entrance plane of the beam shaper is at most approximately three mm and preferably several hundred $\mu$m, and in that at least one of the surfaces of the beam shaper is provided with a grating.

At such a small distance, the diode laser and the beam shaper may be considerably better stabilized with respect to each other than at a distance of the order of a cm or more, as is customary in conventional systems. The desired mutual stabilization of the diode laser and the beam shaper can be realised by fixing the diode laser and the element in a common holder, preferably by securing them to a common support.

The principle of reducing the distance between the diode laser and the beam shaper may be used in a radiation source unit having a conventional beam shaper, such as a cylindrical lens or a prism. This radiation source unit supplies a beam having a circularly symmetrical cross-section whose wavefront is independent of diode laser position changes due to ambient parameter variations.

However, this principle is utilized to an optimum extent in a radiation source unit which is characterized in that the beam shaper is an element in accordance with the present invention as described hereinbefore.

Since the beam shaping in this element is realised by the entrance plane only, mainly the position of this plane with respect to the exit plane of the diode laser is important. The position of the exit plane of the element is then less important so that it is not necessary to impose strict requirements on, for example the thickness, measured along the optical axis, of the beam shaper.

In the radiation source unit the radiation source in the form of a diode laser may exhibit astigmatism, i.e. the origin of the beam in the lateral plane is at a different axial position than in the transversal plane. This source astigmatism can be compensated for by adapting the shape of the toroidal surface or by adapting the distance between the diode laser and the beam shaper.

In certain optical systems, for example for certain printers, it may be further desirable that the ultimately formed radiation spot is elongated. The toroidal surface may be adapted in such a way that the beam emerging from this surface is suitable for forming such a radiation spot. The cylindrical entrance surface may also be adapted to specific requirements and need not be exactly cylindrical.

The invention further relates to an optical scanning device for scanning an information plane, which device comprises a radiation source unit, an objective system for focusing the optical beam supplied by this unit to form a scanning spot on the information plane, and a detection system for converting radiation from the information plane into electric signals representing information stored in the information plane. This scanning device is characterized by a radiation source unit as described hereinbefore.

These and other aspects of the invention will be apparent from and elucidated with reference to the embodiments described hereinafter.

DESCRIPTION OF THE PREFERRED EMBODIMENT

Figure 1:
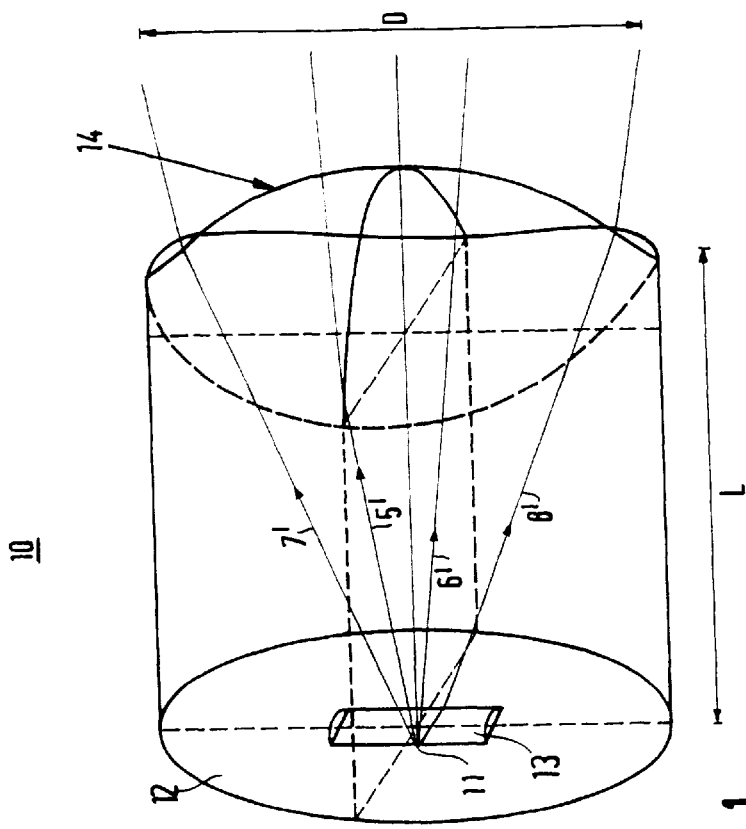
FIG. 1 shows a radiation source unit including the beam shaper.
Figure 1:
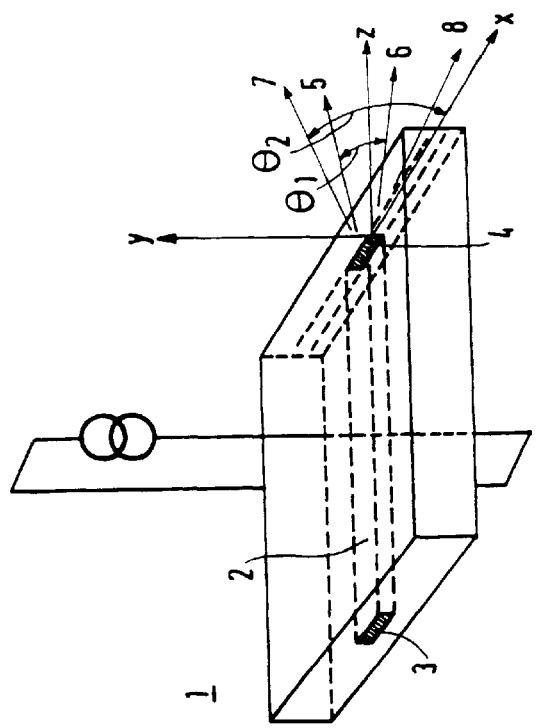
Figure 1A:
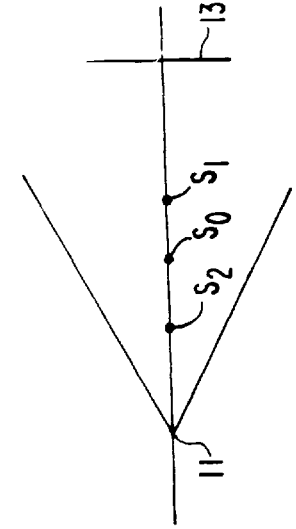
FIG. 1a is an enlarged diagrammatic view of the apparent image points produced by the beam shaper of FIG. 1.

FIG. 1 shows diagrammatically a diode laser 1 and a beam shaper 10, and a three-axis system of coordinates XYZ whose Z direction coincides with the optical axis of the beam shaper. For the sake of clarity the axial distance (in the Z direction) between the diode laser and the beam shaper 10 is exaggerated. Actually, these components are close together and the area 11 at the beam shaper is the laser facet 4 of the diode laser.

This laser is, for example an AlGaAs laser and comprises a plurality of differently doped layers of which, for the sake of clarity, only the strip-shaped active layer 2 in which the laser radiation is generated is shown. The active strip 2 is bounded by a partially transparent laser facet 4 and rear facet 3 so that the laser radiation, which is generated when an electric current from a current source 9 is passed through the laser, can leave the active strip 2. The radiation emerging from the laser facet 4 is used to form a radiation beam, for example for an optical scanning device or for an optical printer, while the radiation emerging through the rear facet 3 may be used to monitor the behaviour of the laser.

Due to the rectangular shape of the cross-section, in the XY plane, of the active strip 2 and of the laser facet 4, the beam emitted by the diode laser is not symmetrical but has an angular aperture $\theta_1$ in the XZ plane parallel to the active strip 2, i.e. the lateral plane, which aperture is smaller than the aperture angle $\theta_2$ in the YZ plane, i.e. the transversal plane. The border rays of the beam in the lateral plane are denoted by the reference numerals 5 and 6 and those in the transversal plane are denoted by the reference numerals 7 and 8. The beam represented by the border rays has an elliptical cross-section in the far field of the diode laser, i.e. at some distance from this laser. To be able to use sufficient power of this beam in, for example an optical scanning device or an optical printer, this beam has to be converted into a beam of a circular cross-section. This is realised by means of the beam shaper 10 according to the invention. This element has an entrance surface 12 with a cylindrical portion 13 whose cylindrical axis is parallel to the Y axis. For the rays in the transversal plane, or YZ plane, the entrance surface is a flat interface between, for example air having a refractive index of 1 and a medium having a higher refractive index n, so that these rays are deflected towards the Z axis to an extent which is determined by n. In other words, an angular reduction of 1/n occurs for these rays. The rays in the beam shaper in the transversal plane now no longer appear to emerge from the laser facet but from a point $S_2$ on the optical axis, which point is located further away from the beam shaper. This is the first elementary imaging step as mentioned hereinbefore.

The second step relates to the effect of the entrance surface in the lateral, or XZ, plane. In this plane this surface has a curvature for which the radius of curvature R, the position $S_0$ on the Z axis of the centre of the radiation source, i.e. the object point, and the position $S_1$ on the Z axis of the image point conjugated thereto by the entrance surface comply with the aplanatic condition. This means that $S_0$ and $S_1$ coincide with the aplanatic points of this, imaging, surface. The positions of the aplanatic points are given by:

$$S_0 = \left(\frac{1+n}{n}\right)R$$

$$S_1 = \left(\frac{1+n}{1}\right)R$$

The rays in the beam shaper in the lateral plane thus no longer appear to emerge from the laser facet at position $S_0$ but from point $S_1$ which is located closer to the beam shaper. The angular magnification in the lateral plane introduced by the entrance surface 12 is equal to n. Since the aplanatic condition is satisfied, the point $S_0$ is imaged without spherical aberration, coma or astigmatism on the point $S_1$. The quality of this image yields a large image field for the cylindrical portion 13, hence ample position tolerances for the beam shaper with respect to the laser facet.

The difference between the angular magnifications realised by the beam shaper 10 in the transversal plane on the one hand and the lateral plane on the other hand is thus approximately $n^2$. This difference, i.e. the beam-shaping power of the element, is thus substantially entirely realised by the entrance surface which changes the vergence of the beam, both in the transversal plane and in the lateral plane. If the beam shaper is arranged in a medium having a refractive index $n_1$ and if the material of this element has a refractive index of $n_2$, the angular magnification in the transversal plane is $n_1/n_2$, i.e. an angular reduction, and the angular magnification in the lateral plane is $n_2/n_1$ and the beam-shaping ratio is approximately $(n_2/n_1)^2$. For the positions of the aplanatic points of the entrance surface it then holds that:

$$S_0 = \frac{n_1 + n_2}{n_2}R$$

$$S_1 = \frac{n_1 + n_2}{n_1}R$$

The third elementary imaging step relates to the transversal plane as well as to the lateral plane and is realised by means of an exit surface 14 of the element 10. Since the two virtual images formed by the entrance surface are located at the different positions $S_1$ and $S_2$ along the Z axis, the exit surface should have a slightly toroidal shape so as to combine these images to one image. Toroidal is understood to mean that the radius of curvature $R_1$ of the surface in the lateral plane differs from the radius of curvature $R_2$ in the transversal plane. The exit surface is arranged at such a Z position that the distance between the laser facet at position $S_0$ and the surface is approximately equal to the average radius of curvature. $R_1$ is slightly smaller than the average radius of curvature so that the radiation in the lateral plane, which seems to be coming from point $S_1$ in the beam shaper, is refracted in such a way that it appears to be coming from point $S_0$. $R_2$ is slightly larger than the average radius of curvature so that radiation in the transversal plane, which seems to be coming from point $S_2$, is refracted in such a way that it also appears to be coming from point $S_0$. By a different choice of the average radius of curvature, the point from which the radiation seems to be coming can be set at a point on the Z axis other than $S_0$. Due to the relatively small angle variations of the radiation upon refraction at the exit surface, this surface has an angular magnification of approximately one.

The toroidal shape is shown in FIG. 1 by the non-coplanar peripheral curve of the exit surface 14. This shape may be expressed in the maximum distance, measured in the Z direction, between two points situated on the same circle on the surface. This top-to-top distance is, for example, of the order of several microns to tens of microns for the edge of the optically used surface. According to the invention, the exit surface may be provided with a grating 14a.

It may be desirable to reduce the angular aperture of the beam emerging from the beam shaper 10 so that the optical elements may have smaller diameters further down the system in which the beam is used. To this end a collimator lens may be arranged behind the element 10. However, the present invention provides a possibility of omitting the collimator lens, viz. by incorporating a collimation function in the beam shaper. To this end a spherical surface having the desired power for the desired reduction of the angular aperture is superimposed on the toroidal exit surface. The spherical surface has the same radius of curvature in the lateral and transversal planes.

In conventional scanning devices for optical record carriers the entrance numerical aperture of the beam shaper is approximately 0.13 in the lateral plane and approximately 0.40 in the transversal plane. Without spherical power of the exit surface in the beam shaper according to the invention an exit numerical aperture of 0.20 can be realised in both planes. By giving the exit surface 14 a spherical power, the exit numerical aperture can be reduced. If this aperture can be made equal to the average entrance numerical aperture, it can be ensured that the image realised by the exit surface satisfies the aplanatic condition in an analogous manner as described with reference to the image realised by the entrance surface 12 in the lateral plane. If the aplanatic condition is satisfied, the tolerance requirements are alleviated so that these requirements can be easily satisfied.

A diode laser beam for which the FWHM angular apertures in the lateral plane and the transversal plane are 10° and 30°, respectively, will have a symmetrical amplitude distribution at the above-mentioned NA values of 0.13 and 0.40 for the beam shaper after passing through this element. The FWHM angular aperture is the mutual angle between those rays which are directed towards two diametrically located points of the wavefront where the intensity is half the intensity in the centre.

If the beam has a Gaussian intensity distribution, the intensity at the edge of the beam emerging from the element may be equal to 40% of the intensity in the centre of the beam. This peripheral intensity is then equal to the intensity loss due to the limited aperture of the element. Then 60% of the radiation emitted by the diode laser is concentrated in such a way that it is available for the optical device accommodating the diode laser.

As is shown in FIG. 1, the beam shaper may have the shape of a cylinder having a circular cross-section with a length L of the same order as the circular diameter D. D and L are, for example 1.2 mm, a value which is defined by ease of handling. The cylindrical portion 13 has a radius of curvature of the order of 15–30 $\mu$m. The wavefront deviation $OPD_{rms}$ has the desired value of 7 m$\lambda$ which is considerably smaller than the Maréchal criterion of 70 m$\lambda$. The value of 7 m$\lambda$ is determined by the astigmatic residual error, partly caused by errors in the image from $S_0$ to $S_2$. If desired, this residual error can be corrected by making the toroidal surface in the XZ plane and possibly in the YZ plane slightly aspherical by adding a small fourth-order correction term. It is alternatively possible to distribute the correction of the residual error across the entrance and exit surfaces by giving the cylindrical portion 13 of the entrance surface a shape which slightly deviates from a cylindrical shape and by rendering the toroidal surface slightly aspherical.

The beam shaper may be made of glass and the entrance surface 12 and the exit surface 14 may be obtained by grinding or moulding. The element may also be made of a transparent synthetic material, for example also by means of moulding. To obtain a beam shaper which can be manufactured in large numbers and at low cost and which is adequately resistant to temperature variations and humidity, a process known as replica process may be used. In such a process one starts from a glass preform and the front and rear sides of this preform are provided with a layer of synthetic material in a sufficiently viscous state, such as a polymer which can be cured under the influence of ultraviolet radiation. These layers may be given the desired shapes of the entrance surface and the exit surface, respectively, by pressing moulds into them whose surfaces are the negatives of the entrance surface 12 and the exit surface 14, respectively. Subsequently, the assembly is illuminated by ultraviolet radiation so that the layers are cured. After removal of the moulds, and without requiring any further operations, the element is ready for use. One or both moulds may be provided with a grating pattern so as to arrange a grating 12a or 14a according to the invention on the entrance or exit surface covering the portion of the surface that is intersected by the beam.

The material polymethyl methacrylate (PMMA) is preferably used as a synthetic material which has a refractive index n of 1.483 so that the beam-shaping ratio $n^2$ may be 2.2. PMMA has the advantage that it does not exhibit much birefringence and that it has yielded satisfactory experience in the manufacture of optical components.

Figure 2:
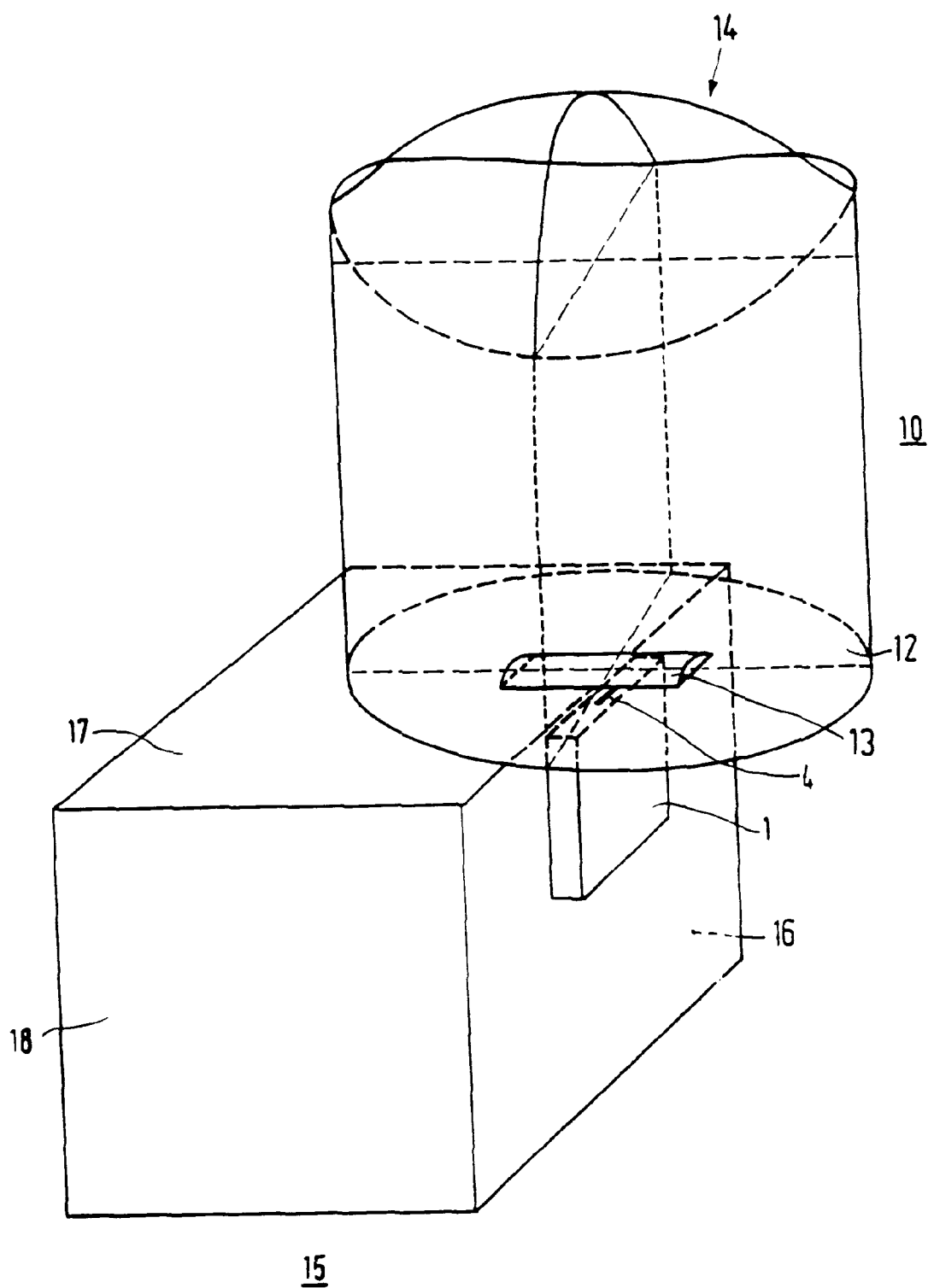
FIG. 2 shows how a diode laser and the beam shaper can be fixed with respect to each other.

The beam shaper is preferably fixed with respect to the diode laser by mechanically securing this element directly onto the diode laser. An example of such a fixation is shown in FIG. 2. The diode laser 1, whose largest surfaces are, for example 300×300 $\mu$m, is secured against a side face 16 of a block 15 of, for example 1×1×1 mm. The beam shaper 10 is arranged on the upper face 17 of the block 15 in such a way that the cylindrical portion 12 of this element is located above the laser facet 4 of the diode laser. The element 10 may be supported by supports (not shown) which are secured to the side face 16 and possibly to the opposite side face 18. The laser facet 4 of the diode laser is now located very close to the cylindrical portion 12, for example at a distance of several tens of microns. Consequently, the desired tolerance of the order of 1 $\mu$m for the distance between this facet and the beam shaper can be achieved in practice so that no unwanted astigmatism occurs in the beam emerging from the beam shaper. Moreover, the laser facet 4 and the beam shaper are fixed with respect to each other so that this unwanted astigmatism neither occurs in the case of changing ambient parameters.

Figure 3:
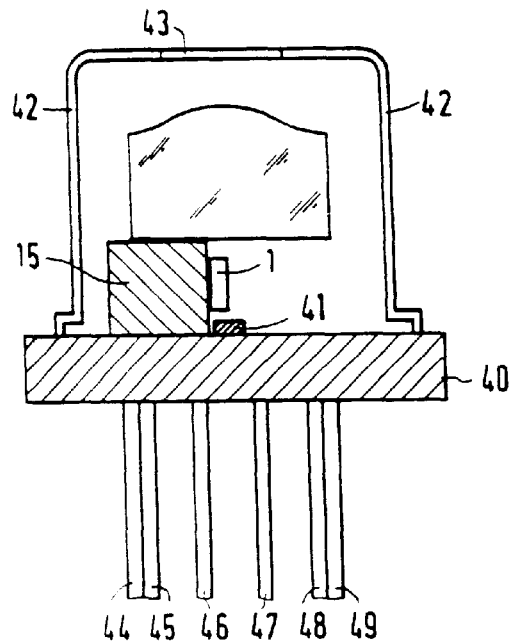
FIG. 3 illustrates how the beam shaper can be accommodated in the housing of the diode laser.

In practice, a diode laser is accommodated in a housing whose side facing the diode laser front facet has a radiation-transmissive window. In known devices the beam shaper is arranged outside the housing and at some distance, for example 1.5 mm from the window, which window is at a distance of, for example 2.5 mm from the diode laser so that the distance between the diode laser and the beam shaper is, for example 4 mm. According to the invention, the beam shaper may be accommodated in the housing at a very small distance from the laser facet, as is shown in FIG. 3. In this Figure the reference numeral 40 denotes a substrate on which the block 15 is arranged and on which a monitor diode 41 and possible further photodiodes are arranged. The side faces of the housing are denoted by the reference numeral 42 and the radiation-transmissive window in the upper face of the housing is denoted by the reference numeral 43. The elements 44 to 49 are some of the connection terminals for the diode laser and the photodiodes.

The following parameter values apply for a first specific embodiment of the beam shaper which is entirely made of the synthetic material PMMA:

Distance to the diode laser $Z_1 = 80 \ \mu m$.
Curvature of the entrance surface:
  in the XZ plane $C_{1x} = -31.25 \ mm^{-1}$;
  in the YZ plane $C_{1y} = 0$.
Thickness $D = 1.16 \ mm$.
Curvature of the exit surface:
  in the XZ plane $C_{2,x} = -0.865 \ mm^{-1}$;
  in the YZ plane $C_{2,y} = -0.734 \ mm^{-1}$.
The following tolerances apply for this element:
  allowed defocusing $\Delta Z_1 = 2 \ \mu m$;
  allowed thickness variation $\Delta D = 25 \ \mu m$;
  allowed refractive index variation $\Delta n = 0.01$;
  allowed decentring:
    in the XZ plane $3 \ \mu m$;
    in the YZ plane $> 25 \ \mu m$;
  allowed tilt about the X axis at least 50 mrad;
  allowed tilt about the Y axis:
    at least 50 mrad at $NA_{exit} = 0.20$;
    at least 15 mrad at $NA_{exit} = 0.13$;
    at least 5 mrad at $NA_{exit} = 0.10$.

In the last-mentioned embodiments with $NA_{exit} = 0.13$ and $0.10$, the exit surface has been provided with spherical power.

For a second specific embodiment of the beam shaper, which is entirely made of the synthetic material polycarbonate (PC), the following parameter values apply:

Distance to the diode laser $Z_1 = 2.0 \ mm$, including a 0.25 mm thick coating glass with $n = 1.514$ for the laser.
Curvature of the entrance surface:
  in the XZ plane $C_{1x} = -2.032 \ mm^{-1}$ and slightly aspherical;
  in the YZ plane $C_{1y} = 0.020 \ mm^{-1}$.
Thickness $D = 2.70 \ mm$;
Curvature of the exit surface:
  in the XZ plane: $R_{2,x} = -0.434 \ mm^{-1}$.
  in the YZ plane $C_{2,y} = -0.166 \ mm^{-1}$ and slightly aspherical.
The following tolerances apply for this element:
  allowed defocusing $\Delta Z_1 = 5 \ \mu m$;
  allowed thickness variation $\Delta D_2 = 20 \ \mu m$;
  allowed refractive index variation $\Delta n = 0.010$;
  allowed decentring:
    in the XZ plane $35 \ \mu m$;
    in the YZ plane $50 \ \mu m$;
  allowed tilt about the X axis: at least 7 mrad;
  allowed tilt about the Y axis: at least 20 mrad.

The beam shaper shapes a beam with NAs of 0.10 and 0.20 in two mutually perpendicular directions so as to obtain an exit beam having a circularly symmetrical cross-section and a NA of 0.15.

Figure 4:
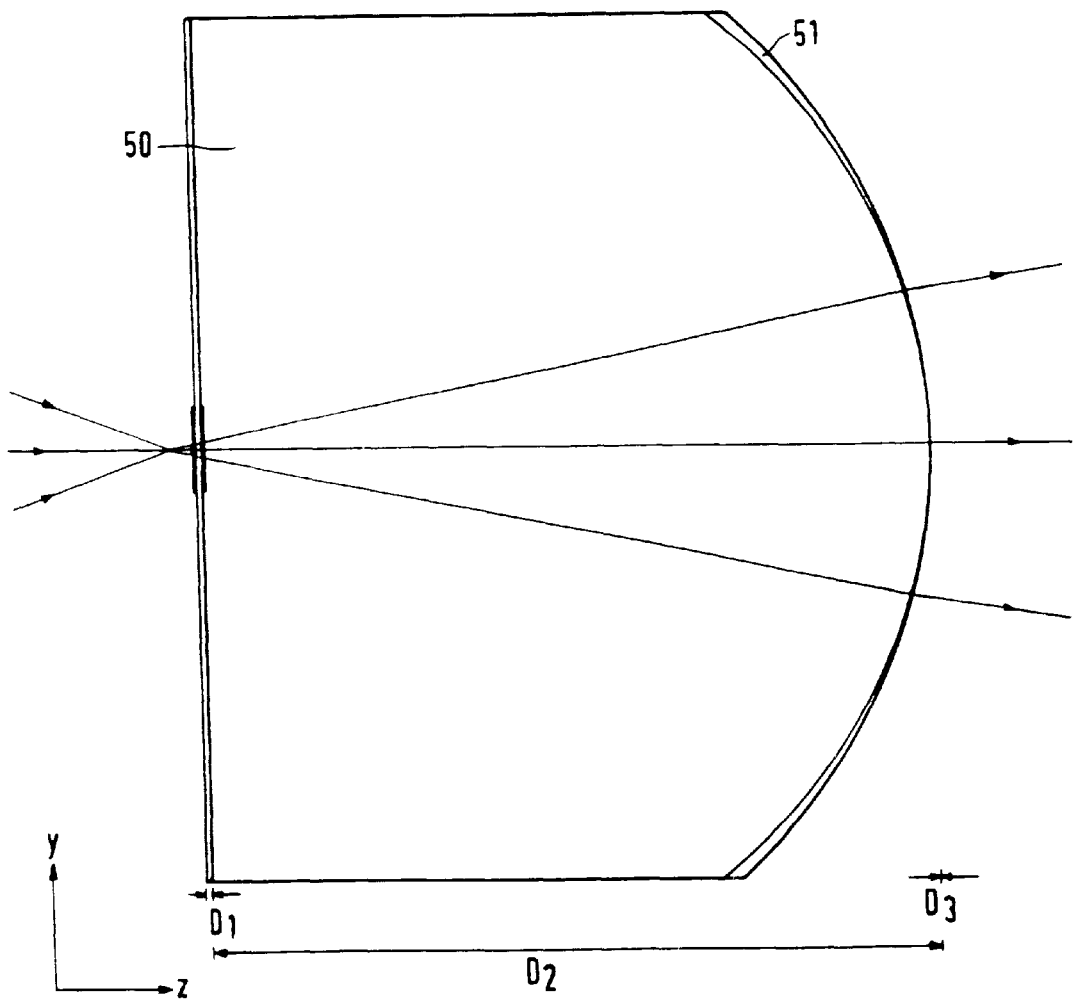
FIG. 4 shows an embodiment of the beam shaper.

For a third specific embodiment of the beam shaper, a cross-section of which in the YZ plane is shown in FIG. 4 and which is made of a preform 50 of glass SFH64 and a layer 51 of the synthetic material Diacryl, the following parameter values apply:

Distance to the diode laser $Z_1 = 90 \ \mu m$
Curvature of the entrance surface:
  in the XZ plane $C_{1x} = -37.1 \ mm^{-1}$;
  in the YZ plane $C_{1y} = 0$.

Thickness $D_1 = 0.017 \ mm$;
$D_2 = 2.50 \ mm$;
$D_3 = 0.002 \ mm$.
Radius of curvature of the exit surface in the XZ plane:
$R_{1x} = -1.859 \ mm$.

In the YZ plane the exit surface is aspherical with a maximum radius of curvature $R_{2y} = -2.023 \ mm$ and aspherical coefficients $a_2 = -0.24715$; $a_4 = -0.0132$.

The following tolerances apply for this element:
  allowed defocusing $\Delta D_1 = 1.5 \ \mu m$;
  allowed thickness variation $\Delta D_2 = 20 \ \mu m$;
  allowed refractive index variation:
    for the glass SFH64 $\Delta n_g = 0.010$;
    for the Diacryl $\Delta n_d = 0.010$;
  allowed decentring:
    in the XZ plane $3 \ \mu m$;
    in the YZ plane $> 25 \ \mu m$;
  allowed tilt about the X axis: 25 mrad;
  allowed tilt about the Y axis: 25 mrad.

The element has a weight of approximately 40 mg. The beam emerging from this element has a circularly symmetrical cross-section and a NA of 0.20. This element receives approximately 94% of the diode laser radiation; the peripheral intensity at NA = 0.20 is approximately 6%. If this element is used in a scanning device for optical record carriers, the optical system of this device selects a circular beam with a numerical aperture of 0.15 embracing 80% of the total intensity. Consequently, the peripheral intensity at a NA of 0.15 is 20%.

Figures 5A, 5B:
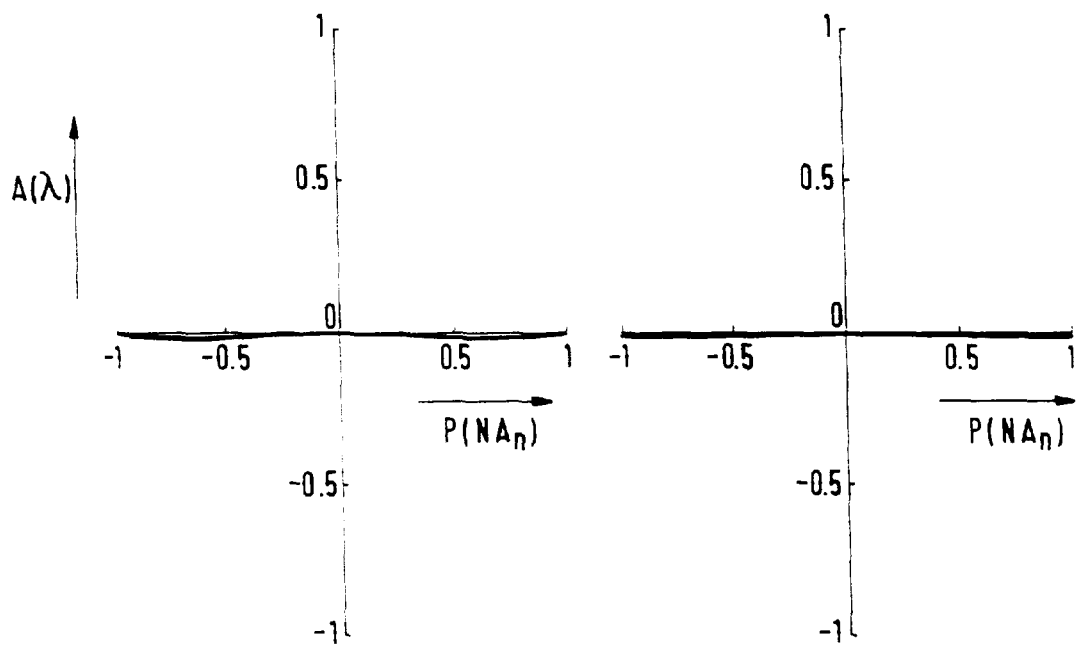
FIGS. 5a and 5b show aberration curves of this beam shaper.

FIGS. 5a and 5b show the aberration curves for the meridional plane and the sagittal plane for an embodiment of the beam shaper made of an SFH16 body and a synthetic material layer with an $NA_{YZ} = 0.160$ and an $NA_{XZ} = 0.150$. In these Figures the wavefront deviation A (in $\lambda$) is plotted on the vertical axis as a function of the position P in the exit pupil (in standardized numerical aperture: $NA_n$). The positioning error in the X direction is $2 \ \mu m$ and in the Y direction $0 \ \mu m$. The $OPD_{rms}$ is 5 m$\lambda$.

Figures 6A, 6B:
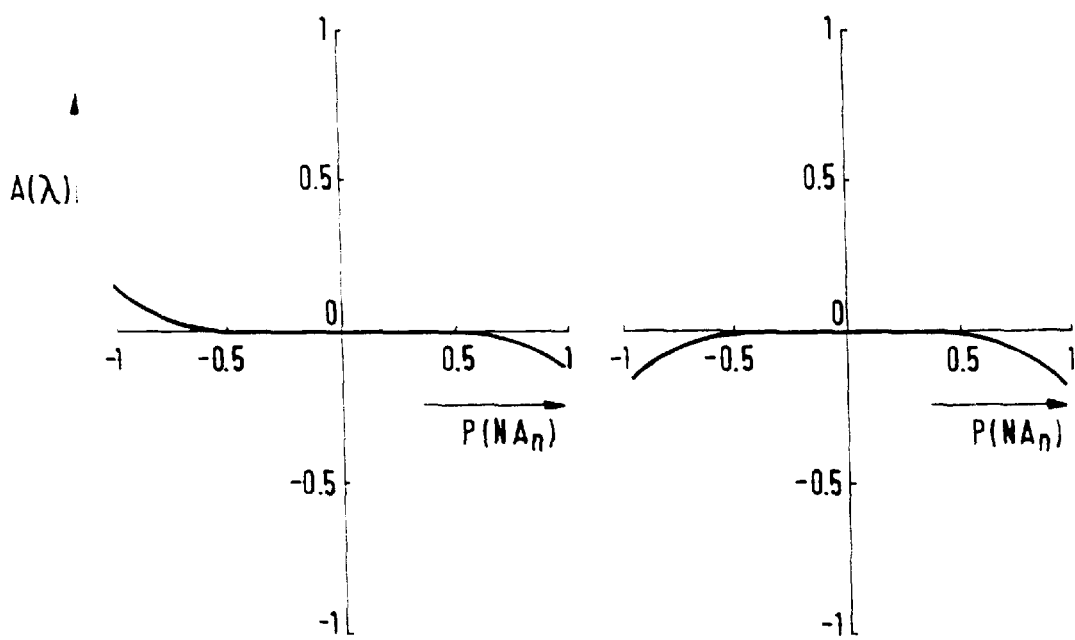
FIGS. 6a and 6b show aberration curves of a known beam shaper.
Figure 7:
FIG. 7 shows a known beam shaper.

For the purpose of comparison FIGS. 6a and 6b show corresponding aberration curves of a known beam shaper. A cross-section in the YZ plane of this element is shown in FIG. 7. The NA of the entrance beam $\theta_i = 0.32$ and the aperture $\theta_2$ of the exit beam is 0.125. For this element the positioning error in the Y direction is $2 \ \mu m$ and in the X direction is $0 \ \mu m$. The $OPD_{rms}$ is 50 m$\lambda$.

Figure 8:
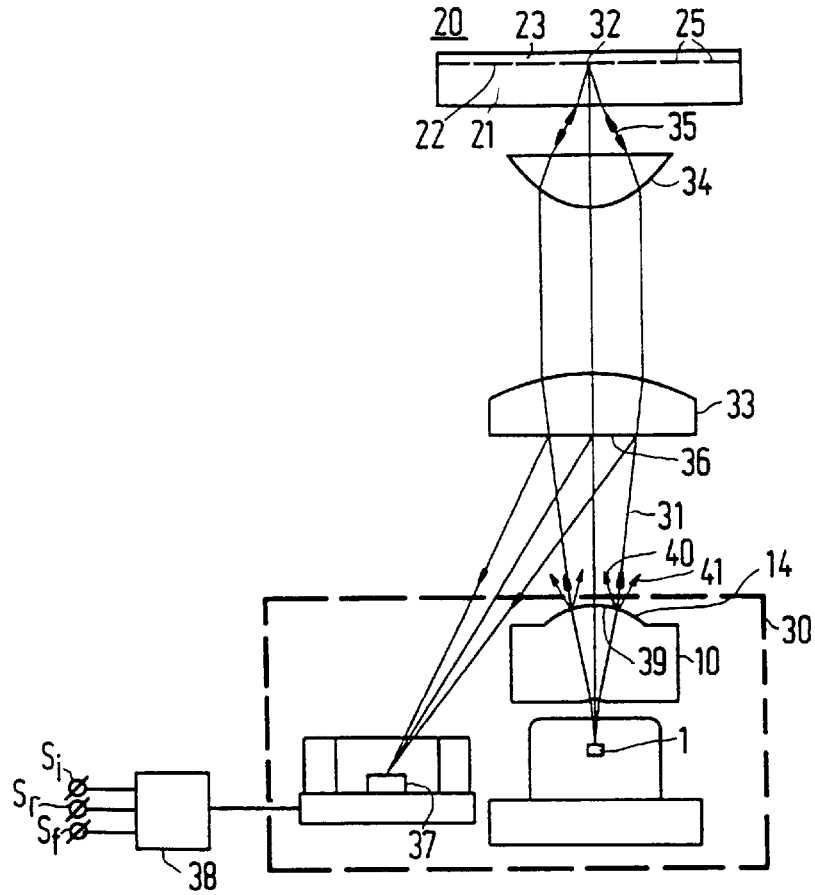
FIG. 8 shows diagrammatically an optical scanning device comprising such a radiation source unit.

FIG. 8 shows diagrammatically a device for optically scanning an information layer of an optical record carrier 20. Scanning is herein understood to mean scanning for both writing and reading information. The information layer may be a prerecorded layer or a layer which can be provided entirely or partly with information. The record carrier 20, a part of which is shown in a radial cross-section in FIG. 8, comprises a transparent substrate 21, a reflecting information layer 22 and a coating 23. The information layer is divided into a large number of tracks 25 in which information is recorded or can be inscribed in the form of information areas (not shown) which are optically distinguished from their surroundings.

The scanning device comprises a radiation source unit 30 which supplies a beam 31 having a circular cross-section and such an angular aperture that it optimally fills a collimator lens 33 and an objective system 34. This system forms a diffraction-limited scanning spot 32 on the information plane. This plane reflects the radiation in a beam 35 which passes through the objective system. To separate the beam 35 spatially from the beam 31, the collimator lens is provided with a separating grating 36 which deflects a portion of the beam 35 by way of diffraction towards a detection system 37 in the radiation source unit 30. An information track can be scanned by rotating the record carrier. All information tracks can be scanned by moving the record carrier with respect to the scanning spot 32 in the radial direction.

During reading, a parameter of the reflected beam, for example the intensity or the direction of polarization, is modulated in accordance with the information stored in the succession of information areas. The detection system 37 converts this modulation into an electric signal. The detection system generally comprises a plurality of detector elements so that it supplies a plurality of output signals which are processed in a signal processing circuit 38 to an information signal $S_i$, a tracking error signal $S_r$ and a focus error signal $S_f$ for a tracking servosystem and a focus servosystem.

For further details of the reading apparatus reference is made to the article "Het systeem "Compact Disc Digital Audio"" by M. G. Carasso, J. B. H. Peek and J. P. Sinjou in Philips Technisch Tijdschrift 40, pp. 267–272, 1981/82, no. 9.

Figure 9:
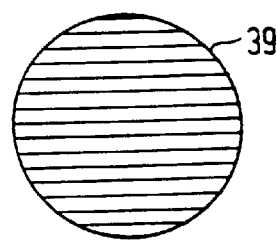
FIG. 9 shows a grating as arranged on the beam shaper according to the invention.

According to the invention, the radiation source unit 30 comprises a diode laser 1 and a beam shaper 10 as described hereinbefore. This radiation source unit supplies a beam having a stable wavefront and an intensity which represents a large part of the intensity produced by the diode laser. The radiation source unit is thus very suitable for a writing device with which information can be written, for example, ablatively, by surface deformation or by a magneto-optical process. During writing the beam 31 is modulated, for example by means of an acousto-optical modulator or by modulating the electric current through the diode laser. According to the invention, the exit surface 14 of the beam shaper is provided with a grating 39 (not shown) for generating two sub-beams 40 and 41, of which only a small portion is shown for the sake of clarity. These two sub-beams supply two side spots at both sides of the scanning spot 32. The radiation reflected therefrom can be detected in the detection system 37 for generating the tracking signal $S_r$ in accordance with the three-beam method known from, inter alia U.S. Pat. No. 3,876,842. The grating 39 is known as a three-beam grating as shown in FIG. 9 and has substantially straight, parallel grating lines. The grating 39 is preferably placed as close as possible to the grating 36.

Figure 10:
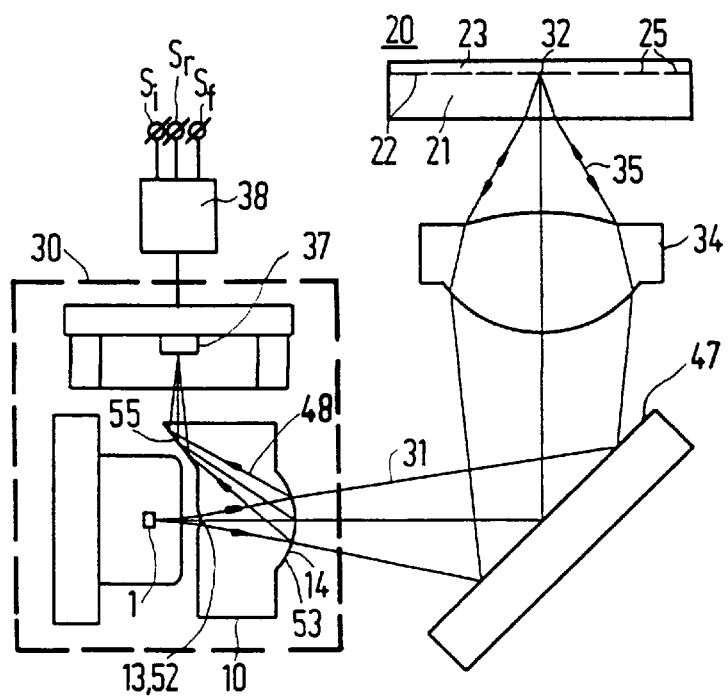
FIG. 10 shows diagrammatically a second optical scanning device comprising a radiation source unit, and FIGS. 11a,b,c show some gratings as arranged on beam shapers according to the invention.

FIG. 10 shows a second, compact embodiment of the optical scanning device. A three-beam grating 52 is arranged on the cylindrical portion 13 of the beam shaper 10, which grating generates two sub-beams (not shown) from the beam 31 emitted by the radiation source 1 for forming a tracking signal. To avoid vignetting of the sub-beams by the objective system, the distance between the laser facet of the radiation source 1 and the three-beam grating should not be too small. A distance of 1 to 2 mm yields only a small vignetting, while the position stability of the grating with respect to the radiation source is within the required tolerance.

The beam 31, including the two sub-beams, is guided towards the objective system 34 via a folding mirror and focused on the information plane 22. The folding mirror reduces the construction height of the scanning device. A separating grating 53 arranged on the exit surface 14 of the beam shaper forms a sub-beam 48 from the beam 35 reflected by the information plane. On the one hand, the angle between the sub-beam and the ongoing beam 31 cannot be chosen to be too large, because the period of the grating lines of the separating grating must then be very small and the grating is more difficult to realise. On the other hand, the angle must be as large as possible so as to have a reasonable distance between the radiation source 1 and the detection system 37, so that the separate components 1 and 37 are not in each other's way. According to the invention, this problem is solved by guiding the sub-beam 48 towards the detection system 37 via an internal mirror 55. The mirror magnifies the angle between the sub-beam 48 and the beam 31 without decreasing the intensity of the sub-beam. The mirror preferably forms part of the beam shaper 10. At a suitable choice of the angle of incidence on the mirror and of the refractive index of the material of the beam shaper, the mirror is totally internally reflecting so that it is not necessary to provide the mirror surface with a reflective coating. The compact arrangement of the radiation source 1, the two gratings 52 and 53 and the detection system 37 ensures a great position stability.

It is possible to guide a second sub-beam formed by the separating grating 53 via a second mirror to a second detection system, in the same way as the sub-beam 48. This second sub-beam extends at the same angle to the beam 31 but is directed downwards in the Figure. An information signal, which may be used to improve the signal quality of the information signal $S_i$ of the detection system 37, can be derived from the output signals of the second detection system. Since the scanning spot formed by the second sub-beam on the second detection system has a less satisfactory quality than that of the sub-beam 48 on the detection system 37, the error signals are preferably derived from the output signals of the detection system 37.

Figures 11A, 11B, 11C:
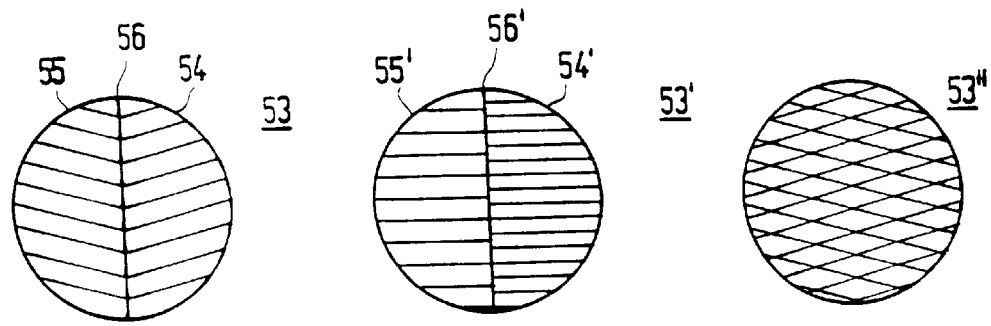

The separating grating 53 may have different shapes, dependent on the configuration of the detectors in the detection system and on the way in which the different signals are derived from the output signals of the detectors. The separating grating may comprise two sub-gratings 54, 55 at both sides of a dividing line 56, while the grating lines in each sub-grating have the same period and extend at equal but opposite angles to the dividing line, as is shown in FIG. 11a. This grating is suitable for forming the focus error signal by means of the single or double-Foucault method and the tracking error signal by means of the two-beam method or the two or three-beam push-pull method. The grating and the associated detector configuration are known, inter alia from U.S. Pat. No. 4,924,079. Another embodiment of the separating grating 53' is shown in FIG. 11b. This grating also comprises two sub-gratings 54', 55' at both sides of a dividing line 56', but the grating lines in the sub-gratings have different periods, as is known from, for example European Patent Application no. 0 583 036. A third embodiment of the separating grating 53", shown in FIG. 11c, comprises two overlapping or interleaving sub-gratings which have either equal or different optical powers, while the grating lines mutually extend at an angle of between 0° and 90°. Such a grating is suitable for determining the focus error by means of the beam size method as is known from Japanese Patent Application no. 1-35 737 (A). By varying the period of the grating lines of the sub-gratings across the sub-gratings, the sub-gratings acquire optical power so that the vergence of the sub-beams formed differs from the beam from which they have been formed. With a special variation of the period and possibly a curvature of the grating lines, it is possible to introduce astigmatism into the sub-beams so that the focus error signal can be formed by means of the astigmatic method which is known, inter alia from U.S. Pat. No. 4,358,200.

FIGS. 8 and 9 only illustrate the principle of an optical scanning device with reference to two embodiments. There are numerous embodiments of this scanning device, and the radiation source unit according to the invention may be used in each of these embodiments. The invention may not only be used in optical devices for scanning optical record carriers, but generally in optical devices which include one or more diode lasers as a radiation source and in which a radiation beam of a high intensity and a wavefront having only small deviations are necessary. An optical printer is an example of such a device.

It is not always necessary to convert a radiation beam having an elliptical cross-section into a beam having a completely circular cross-section, but it may also be sufficient or desirable to convert a beam whose cross-section has a highly elliptical shape into a beam whose cross-section has a less highly elliptical shape. The invention may also be used in optical systems in which the latter is realised. Moreover, it is not necessary to use the two aspects of the invention in combination, because they already present essential advantages of themselves. The idea of arranging the entrance surface of the beam shaper at a short distance from the radiation-emitting surface of the radiation source may also be used in a system with a conventional beam shaper. If the beam shaper according to the invention, in which the angular aperture is magnified in one plane and reduced in a second plane, is arranged at a larger distance from the radiation source, it is also possible to benefit from the less stringent tolerance requirements imposed on this element.

What is claimed is:

1. An optical scanning device for scanning an information plane, comprising a radiation source unit for producing a radiation beam, an objective system for focusing the radiation beam to form a scanning spot on the information plane, and a detection system for converting radiation from the information plane into electric signals representing information stored in the information plane,
    wherein the radiation source unit comprises a radiation source, and a beam shaper for changing the shape of the cross-section of a first beam supplied by the radiation source, said beam shaper having an entrance surface and an exit surface located opposite thereto, said entrance surface and said exit surface having a common optical axis,
    wherein said entrance surface has a substantially cylindrical portion having a cylinder axis, the substantially cylindrical portion having an angular magnification of approximately $n_1/n_2$ in a transversal plane and an angular magnification of approximately $n_2/n_1$ in a lateral plane, where $n_2$ and $n_1$ are the refractive indices of the element material and the surrounding medium, respectively,
    the cylinder axis is located in the transversal plane, and the transversal plane and the lateral plane are perpendicular to each other and intersect each other along said optical axis,
    the exit surface is a toroidal surface, and
    the exit surface is provided with a grating for generating at least one sub-beam from radiation incident on said exit surface.

2. A device as claimed in claim 1, wherein said grating has substantially straight, parallel grating lines for generating first sub-beams from the first radiation beam.

3. A device as claimed in claim 1, wherein the device further comprises at least one servosystem which is electrically connected to the detection system for guiding the scanning spot across the information plane, and
    a processing circuit which is electrically connected to the detection system for generating an electric signal representing information stored in the information plane.

4. A device as claimed in claim 1, wherein said grating is a first grating having substantially straight, parallel grating lines for generating first sub-beams from the first radiation beam, and
    the entrance surface is provided with a second grating for generating a second sub-beam from a second radiation beam incident on the entrance surface.

5. A device as claimed in claim 4, including a mirror for reflecting the second sub-beam.

6. A device as claimed in claim 5, wherein the mirror is totally internally reflecting.

7. An optical scanning device for scanning an information plane, comprising a diode laser having a radiation-emitting surface, for producing a radiation beam, an objective system for focusing the radiation beam to form a scanning spot on the information plane, a detection system for converting radiation from the information plane into electric signals representing information stored in the information plane, and a beam shaper for changing the shape of the cross-section of a first beam supplied by the radiation source, and
    said beam shaper having an entrance surface and an exit surface located opposite thereto,
    wherein the distance between the radiation-emitting surface and the beam shaper is at most 3 mm, and in that an exit surface of the beam shaper is provided with a grating.

8. A device as claimed in claim 7, wherein said grating has substantially straight, parallel grating lines for generating first sub-beams from the first radiation beam.

9. A device as claimed in claim 7, wherein the device further comprises at least one servosystem which is electrically connected to the detection system for guiding the scanning spot across the information plane, and
    a processing circuit which is electrically connected to the detection system for generating an electric signal representing information stored in the information plane.

10. A device as claimed in claim 7, wherein the detection system is arranged in the path of a sub-beam formed by the grating.

11. A device as claimed in claim 7, wherein said grating is a first grating having substantially straight, parallel grating lines for generating first sub-beams from the first radiation beam, and
    the entrance surface is provided with a second grating for generating a second sub-beam from a second radiation beam incident on the entrance surface.

12. A device as claimed in claim 11, including a mirror for reflecting the second sub-beam.

13. A device as claimed in claim 12, wherein the mirror is totally internally reflecting.

14. A device as claimed in claim 7, wherein said entrance surface and said exit surface have a common optical axis, said entrance surface has a substantially cylindrical portion having a cylinder axis, the substantially cylindrical portion having an angular magnification of approximately $n_1/n_2$ in a transversal plane and an angular magnification of approximately $n_2/n_1$ in a lateral plane, where $n_2$ and $n_1$ are the refractive indices of the element material and the surrounding medium, respectively,
    the cylinder axis is located in the transversal plane, and the transversal plane and the lateral plane are perpendicular to each other and intersect each other along said optical axis, and
    the exit surface is a toroidal surface.

15. A device as claimed in claim 14, wherein said grating has substantially straight, parallel grating lines for generating first sub-beams from the first radiation beam.

16. An optical beam shaper having an entrance surface and an exit surface located opposite thereto, said entrance surface and said exit surface having a common optical axis, wherein said entrance surface has a substantially cylindrical portion having a cylinder axis, the substantially cylindrical portion having an angular magnification of approximately $n_1/n_2$ in a transversal plane and an angular magnification of approximately $n_2/n_1$ in a lateral plane, where $n_2$ and $n_1$ are the refractive indices of the element material and the surrounding medium, respectively, the cylinder axis is located in the transversal plane, and the transversal plane and the lateral plane are perpendicular to each other and intersect each other along said optical axis, the exit surface is a toroidal surface, and the exit surface is provided with a grating.

17. A radiation source unit comprising a diode laser having a radiation-emitting surface, for producing a radiation beam, and a beam shaper for changing the shape of the cross-section of the beam, said beam shaper having an entrance surface and an exit surface located opposite thereto, wherein the distance between the radiation-emitting surface and the beam shaper is at most 3 mm, and in that an exit surface of the beam shaper is provided with a grating.

\* \* \* \* \*